United States Patent [19]

Schwartz et al.

[11] Patent Number: 4,949,084
[45] Date of Patent: Aug. 14, 1990

[54] PROGRAMMABLE INTEGRATED CROSSPOINT SWITCH

[75] Inventors: Rod Schwartz, Tempe, Ariz.; John T. Venaleck, Madison; Kenneth W. Braund, Mentor, both of Ohio

[73] Assignee: Ohio Associated Enterprises, Inc., Painesville, Ohio

[21] Appl. No.: 259,496

[22] Filed: Oct. 17, 1988

Related U.S. Application Data

[63] Continuation of Ser. No. 132,907, Dec. 14, 1987, abandoned, which is a continuation of Ser. No. 792,482, Oct. 29, 1985, abandoned.

[51] Int. Cl.$^5$ .............................................. H04Q 1/18
[52] U.S. Cl. ................................. 340/825.83; 357/45; 357/59; 361/393
[58] Field of Search ...................... 357/45, 59 A, 59 R, 357/51, 80; 365/103; 339/17 CF, 18 C; 361/393; 340/825.83

[56] References Cited

U.S. PATENT DOCUMENTS 4,420,820  12/1983  Preedy .............................. 357/59 A Primary Examiner—Douglas W. Olms
Assistant Examiner—Ralph E. Smith
Attorney, Agent, or Firm—Renner, Otto, Boisselle & Sklar

[57] ABSTRACT

An interconnection device in the form of a programmable integrated crosspoint switch includes a matrix of first and second pluralities of electrically conductive paths, e.g. an M line by N line matrix, and selectively permanently and affirmatively programmable switch elements for completing passive conductive circuit paths between one or more of the conductive paths of such first and second pluralities thereof. The programmable integrated crosspoint switch invention may be utilized in various hierarchical levels of interconnection. Each switch element is an irreversible semiconductor switching element, for example of high resistivity polycrystalline material, that initially is a high impedance and, thus, effectively presents an open circuit-like condition, and each may be programmed by applying an appropriate electrical input thereto exceeding a given threshold level, whereupon the element permanently takes on a low impedance characteristic and effectively becomes a closed or short circuit between a respective pair of conductive paths without the need for transistor driving, logic or other circuits for useful operation. Thus, the semiconductor elements provide selectable interconnection at each crosspoint by application of programming voltage between the proper M line and N line of the matrix. The invention also relates to a method for rerouting electrical signals for various purposes.

14 Claims, 4 Drawing Sheets

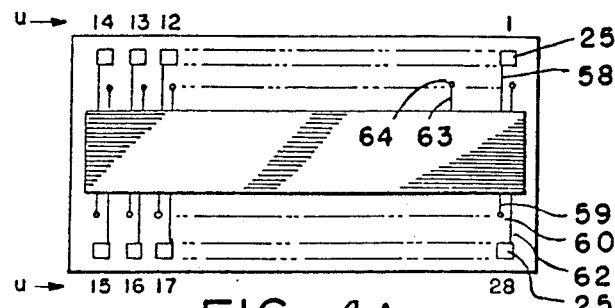
FIG. 4A
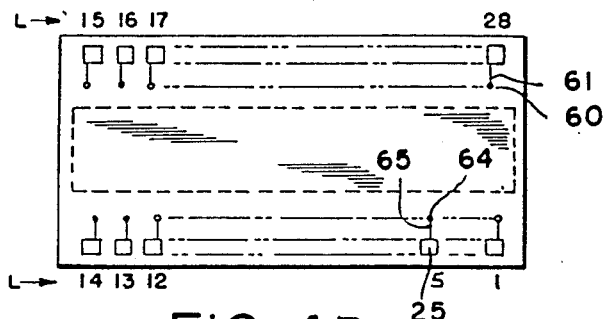
FIG. 4B
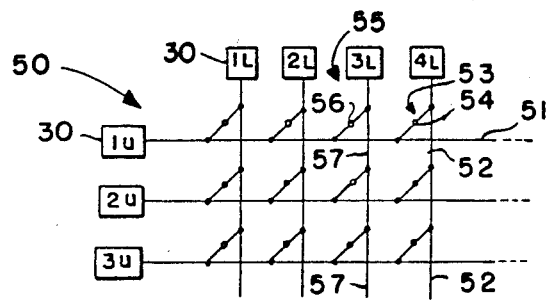
FIG. 5A
| | |
|---|---|
| 1 | → 28 |
| 28 | → 5 |
| 5 | → 10 |
| 10 | → 19 |
| 19 | → 19 |
| 13 | → 16 |
| 16 | → 13 |
| 14 | → 14 |
| 15 | → 15 |
| 2 | → 2 & 1 |
FIG. 5B

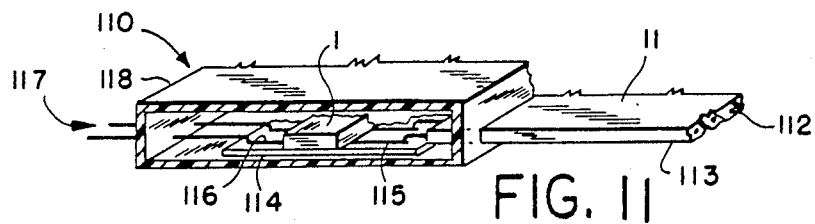
FIG. 11
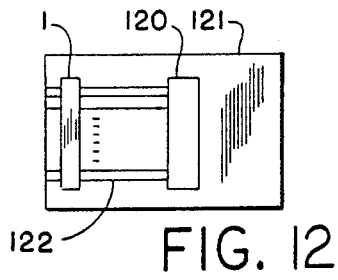
FIG. 12
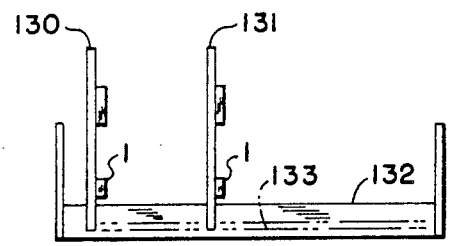
FIG. 13
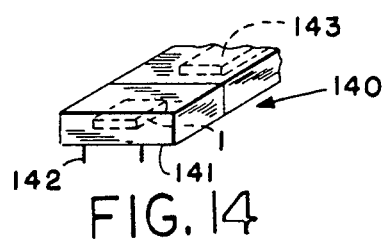
FIG. 14
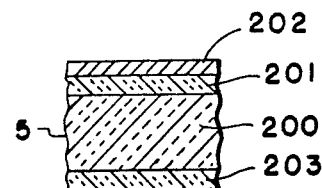
FIG. 17
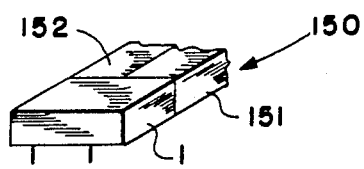
FIG. 15
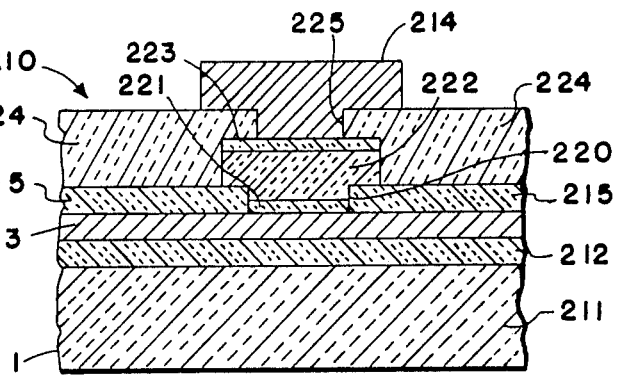
FIG. 16
FIG. 18

PROGRAMMABLE INTEGRATED CROSSPOINT SWITCH

This is a continuation of co-pending application Ser. No. 132,907 filed on Dec. 14, 1987, now abandoned, which is a continuation of Ser. No. 792,482, filed Oct. 29, 1985, now abandoned.

TECHNICAL FIELD

The present invention relates, generally, to electrical interconnection devices and, more particularly, as indicated to a programmable integrated crosspoint switch. Moreover, the invention relates to the use of a programmable polycrystalline silicon semiconductor switching element to provide an irreversible interconnection pattern in an N by M line matrix.

BACKGROUND

Various devices and connection arrangements have been used in the past to provide electrical interconnection between plural electrical paths, circuits, devices, etc.

Hierarchical levels of interconnection may be identified, as follows:

Level I. Component Level: At this level interconnection is effected within an electrical or electronic component. Examples of the component level of interconnection include metallization pattern on an integrated (IC) chip, lead bonding of the IC, and wiring of components to lead frames, terminals or component packages.

Level II. Circuit Card Level: Interconnection is provided at this level among components mounted to a rigid planar substrate. Examples include printed wiring boards, wire wrap socket panels and other metallized substrates.

Level III. Subassembly Level: Interconnection at this level is provided within an assembly produced for separate installation into a system. Examples are interconnection within backpanels, powere supplies, keyboards, switches, displays, component panels, and so on.

Level IV. Chassis Level: At this level interconnection is provided of components, corcuit cards, backpanels or subassemblies within a chassis.

Level V. System Level: This level includes interconnection of different chassis at the system level. Examples of implementation of this System Level of interconnection include wire and cable connections among and/or between plural chassis external of the chassis.

Several types of semiconductor circuites and devices are dependent on switching elements which provide a one-time programmable interconnection or open circuit. Examples are programmable read only memory (PROM), programmable array logic (PAL) and field programmable logic arrays (FPLA). The purpose of these circuits is to store an unchanging configuration of bits, such as a computer program or to connect a specific configuration of logic from a general programmable form. The switching elements used in practical devices of these types include diodes, transistors, thyristors, and fuses of various materials.

In a fusible link PROM, for example, fuses made of silicon, nickel chromium alloy or aluminum are incorporated into each cell or bit of the PROM. In its unprogrammed state, all fuses are intact representing all bits set to the same logic state (1 or 0). Writing a bit pattern into the PROM consists of addressing each cell where it is desired to change the static bit pattern and blowing a fuse at that location. This changes the location from a one to a zero or a zero to a one, depending on the definition of the background or shorted pattern. Typically, the fusing current is routed to the proper cell via active addressing logic and/or current steering diodes. The contents of the cell are read by active circuitry in the PROM device and the reesults are presented at the outputs of the memory.

In a zener diode type of PROM, the characteristics of the diode are changed by reverse biasing the diode to breakdown and increasing its power level to the point where a short circuit is formed across the diode. The presence of a 5 volt to 7 volt reverse breakdown versus the short circuit condition formed by programming is made use of in the memory to descriminate between ones and zeros.

A form of logic called programmable array logic (PAL) uses fuses to reconfigure a general purpose logic configuration into a specific form. Programming consists of opening fuses to disconnect outputs or inputs and to configure the desired logic form. A similar type of device is the field programmable logic array (FPLA) which may be considered the equivalent of a PROM without all address possibilities being decoded. In this case, fuses are blown to configure desired output response to a given set of input stimuli.

In the above-discussed circuits the switching elements generally are used in rather low current configurations. Fuses typically used in integrated circuit PROMs range from say about 50 to about 200 Ohms in their shorted condition. Even at these levels, considerable current, e.g. on the order of from say about 20 to about 200 milliamps is required to blow open a typical integrated circuit fuse. If lower impedances for the fuses are attempted, the programming current rises correspondigly. In the case of the shorted diode version of a PROM, the interconnection formed when the junction is shorted consists primarily of a very fine string of aluminum metalization. This metalization may be sufficient to give low impedances; however, the sectional area of the conducting path is typically too small to provide for passage of large currents. In addition, both the fusible link type PROMs and the shorted diode type PROMs require extensive current steering within the structure of the device to allow blowing the proper link or diode. Such circuitry then typically may be used as part of the sensing circuitry to read the contents of the memory, or in the cases of programmable logic families, may be part of the inherent structure.

When attempting to use the above switching elements in a matrix configuration, current steered programming using active elements may not be feasible. In the case of the fuse element, attempts to use a simple array of fuses without current steering may result in non-unique programming paths due to lack of uniformity of fuse impedances. Also, the series resistance of the fuse may be too high to provide a good signal interconnection path for high level signals.

Another type of irreversible semiconductor switching element useful in semiconductor PROMs is disclosed in U.S. Pat. No. 4,146,902. This patent discloses a switching element employing a high impedance polycrystalline silicon (sometimes referred to herein as polysilicon) resistor which may be irreversibly switched from a high impedance state after being once written on by the application of a programming level voltage above a thereshold voltage level. Such switching element is disclosed as a discrete device or as part of a low level programmable biasing path within the structure of a read only memory specifically determining whether a given memory cell will appear as a logic 1 or as a logic 0. Active circuitry is required to steer the programming voltage to the proper cells and to read the contents of the cells after programming. Thus, the switching element of such patent is used as a memory cell, and a semiconductor gate element for controlling the current flowing through the semiconductor switching element is combined with the former to complete a memory device. The entire disclosure of U.S. Pat. No. 4,146,902 hereby is incorporated by reference.

Tanimoto "A Novel MOS PROM Using a Highly Resistive Poly-Si Resistor," *IEEE Transactions On Electron Devices*, Vol. Ed. 27, No. 3, March 1980, presents another description of a memory cell like that of the '902 patent. The entire disclosure of such article also is hereby incorporated by reference.

A semiconductor memory device that uses memory cells located at cross positions of a plurality of bit lines and a plurality of word lines is disclosed in U.S. Pat. No. 4,287,569. The memory cells include an active element, e.g. a transistor, and a diode or fusible link. Such cells are intended to be specifically written to either by overloading a diode to short circuit the same or by blowing a fusible link to open the same, and the information in a given semiconductor memory device can be read out.

In commonly assigned, copending U.S. patent application Ser. Nos. 471,280 filed Mar. 2, 1983, Ser. No. 571,737 filed Jan. 18, 1984, and Ser. No. 614,275 filed May 25, 1984, are disclosed several devices and connection arrangements used, for example, as programmed or programmable programmed interconnection device. The entire disclosures of such applications, which now are presented in respective U.S. Pat. Nos. 4,588,239, 4,577,540 and 4,609,241, hereby are fully incorporated by reference.

One exemplary use of such programmed or programmable programmed device, as is described in such patent applications is to adapt the pin out configuration of one integrated circuit device to a different apparent pin out configuration to enable such device to be used in connection environment for which it may not originally have been intended. Another examplary use is as a shunt device to connect within the device one or more circuit paths, contacts, etc. in the device.

In the '275 application is disclosed a device that may be selectively programmed to determine which of plural circuits, conductive paths, or the like are to be electrically connected. In one embodiment there is a matrix formed of plural conductive paths or groups thereof in the device and "blowable" fuses, fused links, blown junctions or the like; the latter interconnect each path with a plurality of, preferably all, the others in the other groups in the matrix. The fuses, links, etc. may be blown to open respective circuits while other circuits are allowed to remain complete. As was noted above, a disadvantage with such device is that it is possible that the impedances of respective fuses may vary to such an extent that accurate programming may not be possible or may be possible only with great difficulty and with the result that some parts may have to be scrapped. Various other disadvantages of such blown fuse, blown junction, etc. types of devices are described in U.S. Pat. No. 4,146,902.

SUMMARY OF THE INVENTION

Briefly, the fundamental components of the programmable integrated crosspoint switch according to the invention include a matrix of first and second pluralities of electrically conductive paths, on M line by N line matrix, and selectively permanently and affirmatively programmable means for completing passive conductive circuit paths between one or more of the conductive paths of such first and second pluralities thereof. Being conductive and passive, such circuit paths and the programmable means forming them are bilateral; they conduct in both directions and are not restricted so in the case of diode, transistor and similar devices of the prior art, e.g., as exemplified by the mentioned U.S. Pat. No. 4,146,902, which utilizes transistorized circuitry. The programmable integrated crosspoint switch of the invention may be utilized in each of the above identified hierarchical levels of interconnection.

Representative aspects and objects of the invention follow.

According to one aspect of the invention, the programmable means is a plurality of irreversible semiconductor switching elements of the type disclosed in U.S. Pat. No. 4,146,902. Each of such switching elements initially is a high impedance and, thus, effectively presents an open circuit-like condition, and each may be programmed by applying an appropriate electrical input thereto to exceed a given threshold level, whereupon the element takes on a low impedance characteristic and effectively becomes a closed circuit between a respective pair of conductive paths without the need for transistor driving, logic or other circuits for useful operation.

In accordance with another aspect of this invention, there is provided a semiconductor crosspoint matrix switching device having a semiconductor element at each crosspoint in the matrix which may be irreversibly programmed from the open to the short circuit condition by application of proper programming voltage between the corresponding input and output lines of the matrix.

According to a further aspect, there is provided a programmable switching matrix device which through proper programmation allows N input lines to be routed in any desired manner to M output lines thus changing the order but maintaining the signal characteristics of the input.

According to still another aspect the integrated crosspoint switch, including the matrix and the switching elements, is in a housing with a lead structure of an integrated circuit package for use as a programmed socket, programmed shunt or like device.

According to still a further aspect the integrated crosspoint switch is use and usable to switch the positions of inputs and outputs of electrical connectors, sockets, printed circuit boards, chassis, and other electrical and electronic parts and devices.

According to still a additional aspect the invention provides means to unscramble leads, traces or signals on a multiple layer printed circuit board. The integrated crosspoint switch also may be used as a cable signal or trace uncscrambler to interrupt a cable and reroute the lines (leads) thereof without requiring special adaptations in the cable connector(s). Indeed, the invention facilitates the redirecting of lines (leads, conductive paths, etc.) in virtually any electrical multiple line system.

Another aspect of the invention is the ability of the programmable integrated crosspoint switch to give a specific or personalized signature to an integrated circuit chip or the like by establishing a certain lead functional pattern therefor; in fact the invention permits a given chip to have multiple characteristics that can be selectively used depending on the states/conductive paths of the programmable integrated crosspoint switch.

Exemplary objects of this invention include to provide a novel, programmable crosspoint switch matrix; to provide a programmable matrix interconnection device using semiconductor technology; to provide a matrix interconnection device utilizing switches capable of an irreversible change of state upon application of proper programming voltages; to provide a matrix switch capable of being manufactured utilizing known fabricating processes for LSI (large scale integration) integrated circuits; to provide a matrix switch requiring only passive elements for completing respective circuit paths; and effectively to use such programmable integrated crosspoint switch in electrical and electronic apparatus, such as, for example, programmable sockets, programmable shunts, cable termination assemblies, with logic structure for signature, scrambling, and unscrambling purposes; and to employ programmable interconnection functions for other purposes and in other devices, as well.

These and other objects and advantages of the present invention will become more apparent as the following description proceeds.

To the accomplishment of the foregoing and related ends, the invention, then, comprises the features hereinafter fully described in the specification and particularly pointed out in the claims, the following description and the annexed drawings setting forth in detail a certain illustrative embodiment of the invention, this being indicative, however, of but one of the various ways in which the principles of the invention may be employed.

BRIEF DESCRIPTION OF THE DRAWINGS

In the annexed drawings:

FIGS. 4A and 4B are, respectively, top and bottom views of the support of FIG. 3;

FIGS. 5A and 5B are, respectively, a partial view of the conductor matrix and semiconductor switch elements array used in the programmable programmed socket and a table illustrating an exemplary transposition of pin configurations achievable by the programmable programmed socket of the invention;

FIG. 11 is a schematic representation of a programmable cable termination assembly employing the programmable integrated crosspoint switch of the invention;

FIG. 12 is a schematic view of a programmable integrated crosspoint switch mounted on a printed circuit board with an integrated circuit;

FIG. 13 is a side elevation view of plural printed circuit boards mounted on a common chassis and employing programmable integrated crosspoint switches to facilitate bringing out the circuit connections of the printed circuit boards;

FIG. 14 is a schematic representation of a programmable integrated crosspoint switch used as a signature device;

FIG. 15 is a schematic representation of a programmable integrated crosspoint switch used as a circuit select device in an integrated circuit;

FIG. 16 is an isometric view of a programmable programmed shunt using the programmable integrated crosspoint switch of the present invention;

FIG. 17 is a diagramatic representation showing the basic construction of the irreversible semiconductor switching element of this invention; and FIG. 18 is a fragmentary cross sectional view of the matrix of FIG. 1 showing one switching element of FIG. 17, and manufactured with planar semiconductor techniques.

DESCRIPTION OF THE PREFERRED EMBODIMENT

Figure 1:
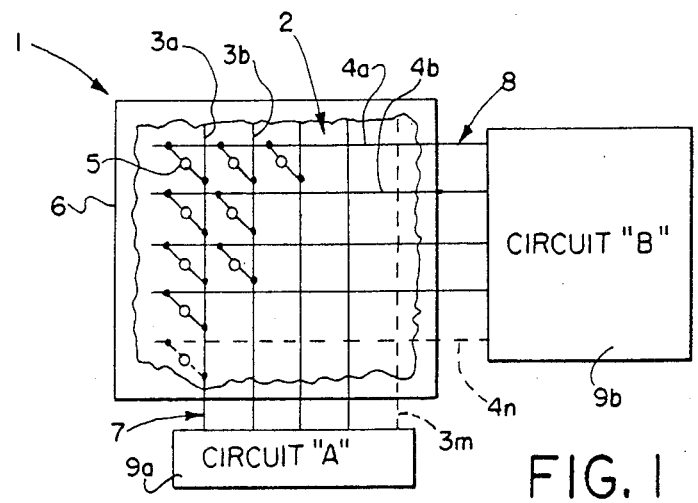
FIG. 1 is a schematic representation of the programmable integrated crosspoint switch in accordance with the invention.

Referring in detail to the drawings, wherein like reference numerals refer to like parts in the several figures, a programmable integrated crosspoint switch in accordance with the invention is schematically illustrated at 1 in FIG. 1. The programmable integrated crosspoint switch 1 includes a matrix 2 of two groups 3,4 of M conductors $3a, 3b, \ldots, 3m$, etc. and N conductors $4a, 4b, \ldots, 4n$, etc. preferably physically oriented in orthogonal directions, as is shown, so that plural (preferably all) of the conductors of one group cross without connecting to plural (preferably all) the conductors of the other group. The programmable integrated crosspoint switch also includes plural semiconductor switches 5 that are at the junctions of each of the M conductors 3 with the N conductors 4 and are selectively programmable to establish connections between respective pairs of conductors, one (or more) from the first (M) group and one (or more) from the second (N) group.

The matrix 2 and switches 5 of the programmable integrated crosspoint switch are included preferably in the programmable integrated crosspoint switch housing 6 of appropriate electrically non-conductive material typically used, say, in the semiconductor/integrated circuit package industry. From the housing 6 are exposed plural electrical leads designated input leads 7 and output leads 8 for convenience. The leads 7,8 are coupled to respecive circuits $9a, 9b$. The programmable integrated crosspoint switch is intended to provide selected electrically conductive paths between the two circuits $9a, 9b$.

Figure 2:
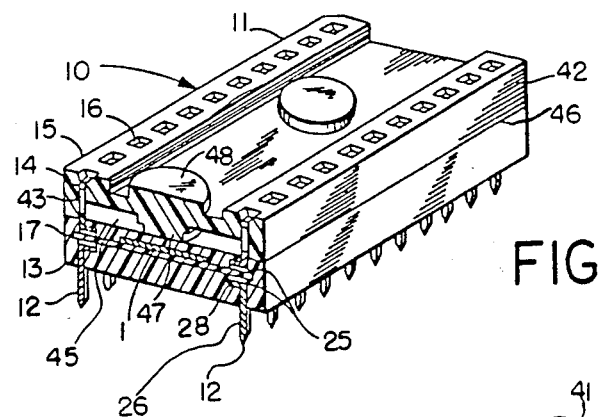
FIG. 2 is a partial isometric view, partly broken away in section, of a programmable programmed socket employing the programmable integrated crosspoint switch in accordance with the invention.
Figure 3:
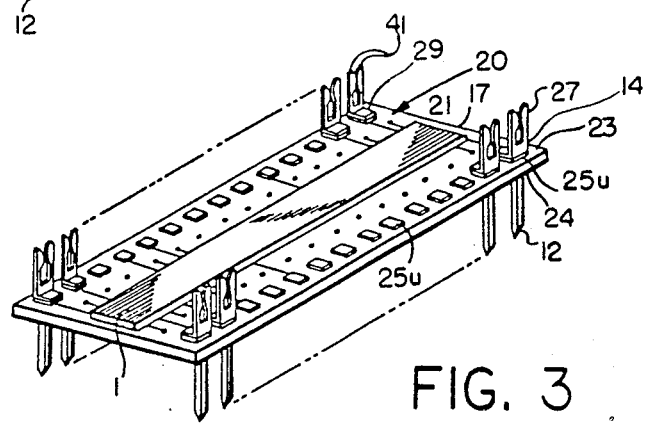
FIG. 3 is an isometric view of the support, contacts, programmable device, and some printed circuit traces used in the programmable programmed socket of FIG. 2.

The circuits $9a, 9b$ may be a variety of different devices or portions of devices. Fundamentally, the programmable integrated crosspoint switch may be used to provide connections between two electrical circuits, devices, components, or the like which otherwise may have a specific incompatibility insofar as lead to lead, circuit to circuit or like matching is concerned. In the preferred embodiment and best mode of the present invention, the circuits 9a, 9b represent printed circuit traces and electrical contacts of a programmable programmed socket type device, e.g. as is illustrated in FIGS. 2 and 3; in such case the circuits 9a, 9b may be, respectively, the lower contacts and traces and the upper contacts and traces used in the programmable programmed socket of FIGS. 2–9.

Turning now to the details of the programmable integrated crosspoint switch 1 of FIG. 1, according to the preferred embodiment and best mode of the present invention, the programmable integrated crosspoint switch 1 is formed using solid state integrated circuit technology. Most preferably the methods and materials disclosed in U.S. Pat. No. 4,146,902 are employed in the programmable integrated crosspoint switch 1. Each semiconductor switch element 5 may be formed of a high resistivity polycrystalline silicon resistor. Such resistor physically separates the terminal means or lead connections 5t which are electrically connected to respective leads of the matrix 2, whereby the high impedance of the resistor essentially makes the switch element 5 appear initially as an open circuit.

The semiconductor switch element 5, on the other hand, has an irreversible impedance characteristic. In particular, in response to application thereto of a voltage of suitable magnitude exceeding a prescribed threshold voltage, the impedance of such resistor changes dramatically and permanently to a low impedance level. For example, the ratio of the lower and greater resistivity levels of the semiconductor switch element 5 may be $1:10^4$. In the greater resistivity level the switch element 5 essentially appears as an open circuit. At the lower resistivity level, the switch element 5 appears essentially as a conductor or a conductive path. The bilateral nature of a conductive path, according to the invention, excludes a unilateral conducting device or a threshold device, such as a diode or transistor.

According to the preferred embodiment and best mode of the present invention, the switch elements 5 are of the passive type in that they ordinarily do not require additional transistor or other components to operate to complete respective electrical circuits or to cause open circuits. Therefore, the switch elements may be left alone in high impedance condition to cause effectively an open circuit between a respective pair of conductors of the matrix 2 or may be programmed to complete a circuit between a respective pair of such conductors.

The conductors 3, 4 of the matrix 2 and the switch elements 5 may be formed by conventional semiconductor and integrated circuit manufacturing processes, e.g. as is described in the aforementioned applications and patents. For example, the conductors 3, 4 and the switch elements 5 may be formed on a substrate, with the terminal or lead portions of the conductors 3, 4 being exposed for further electrical connection to another device, circuit, contact, etc. Thereafter, appropriate packaging of the matrix 2 and switch elements 5 may be provided, e.g. in a conventional integrated circuit package with the conductors 3, 4 being coupled to contacts for use as a programmable programmed socket, as is described in further detail below.

A programmable programmed socket embodying the programmable integrated crosspoint switch 1 of the invention is generally indicated at 10 in FIG. 2. The programmable programmed socket 10 is in the configuration of an integrated circuit package, integrated circuit socket, etc., in the form of a dual in-line package 11. The fundamental components of the programmable programmed socket include a plurality of male pin contacts 12 extending from the bottom 13 of the package 11 for connection, for example, directly to the printed circuit traces on a conventional printed circuit board, say using wave soldering techniques to effect completion of connections, by an integrated circuit socket, etc.; a plurality of female fork type contacts 14 facing the top 15 of the package 11 to connect with the pins of an integrated circuit device inserted into openings 16; a support 17 for supporting the contacts; a programmable integrated crosspoint switch 1 for electrically connecting respective contacts; and printed circuit connections 19 for connecting the contacts to the programmable integrated crosspoint switch 1. The contacts 12, 14 may be of a type other than those shown, e.g. they both may be male, both female, or they may be of another configuration altogether.

The programmable programmed socket 10 of the present invention provides an interface between circuitry to which the male pin contacts 12 are connected and circuitry to which the female contacts 14 are connected. The male pin contacts 12 and the female contacts 14 preferably are arranged in identical patterns on the support 17 so that the programmed socket 10 requires minimum space, and the only electrical connections between respective male pin contacts 12 and respective female contacts 14 is by means of printed circuit connections 19 in the form of traces generally indicated at 20 on and plated through holes 21 through the support 17 and the programmable integrated crosspoint switch 1.

The programmable integrated crosspoint switch 1 according to the invention may be programmed to provide electrical connections between respective pairs or more of electrical contacts. An example of such a programmable integrated crosspoint switch 1 is described above.

The programmable integrated crosspoint switch 1 may be die bonded to the surface of a printed circuit board material, such as that of which the support 17 is made. Moreover, the leads of the programmable integrated crosspoint switch 1 may be wire bonded to respective printed circuit traces 20 formed on the support 17. The plated-through holes 21 enable the contacts on the side of the support 17 remote from the side on which the programmable integrated crosspoint switch is mounted to be connected to respective leads of the programmable integrated crosspoint switch.

By programming the programmable integrated crosspoint switch 1, the apparent location of any given pin of an integrated circuit device plugged in to the top of the programmable programmed socket 10 can be programmed to appear at another selected location at the bottom of the programmed socket. Thus, for example, one integrated circuit device having pin number 28 as a ground may be replaced by another integrated circuit device that uses pin number 1 as the ground with the programmable programmed socket 10 of the present invention connecting contact location number 1 on the top of the programmable programmed socket to contact location number 28 on the bottom of the programmable programmed socket.

The support 17 preferably is a printed circuit board of electrically non-conductive material. The printed circuit traces 20 preferably are formed on the support 17 in conventional manner. The support 17 has a plurality of holes 21 therethrough, each of which preferably is plated through to provide an electrically conductive path from the top side or surface 23 to the bottom side or surface 24. (Reference to top and bottom or upper and lower as well as to surfaces and sides herein are for convenience only and are not intended to be limiting with respect to configuration or operation of the programmable programmed socket 10).

Each of the printed circuit traces 20 terminates in a terminal pad, such as those shown at 25 in FIG. 3. Each of the contacts 12, 14 has a contact portion 26, 27 extending generally linearly in a direction to be electrically connected to a member placed to engagement therewith and a flat base portion 28, 29 extending generally perpendicularly to the contact portion for electrical connection to respective terminal pads. Respective contacts 12, 14, are soldered to such pads 25 for electrical and mechanical connection thereto. Preferably the pads 25U (the suffix "U" indicating upper) on the top 23 and those pads 25L ("L" for lower) on the bottom 24 of the support 17 are arranged in an identical dual-in-line pattern, as is shown in the drawings, and, accordingly, the contacts 12 are arranged in the same configuration, layout, or pattern as are the contacts 14. Therefore, the pad 25U at contact location 1 on the top 23 is directly over the pad 25L at contact location 1 on the bottom 24 of the support 17. In the illustrated embodiment there are 28 contact locations on each side of the support 17 corresponding in number and spacing to the pins of a conventional 28-pin DIP integrated circuit device.

Methods for making the programmable programmed socket 10 are disclosed in the above copending patent applications. One step in such methods may include the encapsulating of the support 17, programmable device 18 and printed circuit traces 20 and plate-through holes 21 thereon, and preferably at least a portion of each of the contacts 12, 14, for example to a depth away from the surface of the support 17 that is adequate at least to cover the respective bases 28, 29 of the contacts. Such encapsulating may be carried out in a plastic injection molding machine to provide the encapsulating lower body 40 clearly seen in FIG. 2. The body 40 may be formed of electrically non-conductive plastic or plastic-like material having adequate strength securely to hold the male pin contacts 12 in relatively rigid extending format seen in FIG. 2 and also to hold the female contacts 14 securely with respect to the support 17, on the one hand, while permitting resilient bending of the contact tines 41 (FIG. 3) to receive a male contact inserted therebetween. In addition to providing the structural strength, the encapsulating body 40 also preferably provides an hermetic seal enclosing the junctions of the leads 19 (30) with respective traces 20 and of the terminal pads 25 with respective contacts 12, 14, which helps to prevent oxidation or other chemical activity at the junctions that would tend to reduce the electrical conductivity, for example, thereof. The encapsulating body 40 also protects the electrical integrity of the printed circuit traces 20 and plated through holes 21, for example helping to avoid damage thereto as forces are applied to the contacts 12, 14 during use of the programmed socket 10 and by preventing entry of foreign substances to various parts of the programmable programmed socket 10 to avoid damage, short circuiting, etc. Such encapsulation may be used in the several embodiments of the invention disclosed herein.

A cover 42 (FIG. 2) preferably of electrically non-conductive plastic or plastic-type material is placed over the female contacts 14 to protect the same and to guide male contacts, such as the pins of an integrated circuit device, through openings 16 to engage respective pairs of tines 41 of the female contacts. Within the cover 42 may be a plurality of discrete chamber areas 43 within which individual female contacts 14 are located and preferably guided into alignment with respective openings 16. A hollow space 45 formed in the cover provides resiliency thereof, minimizes material required, tolerances imperfections in the encapsulating body, and facilitates providing deformation space for the female contacts 14. The cover 42 is ultrasonically welded at 46 to the encapsulating lower body 40; alternatively, other means may be employed to secure together the cover and encapsulating body. Further securing the cover to the encapsulating body a weld tab 47 is formed on the bottom of the cover, and such weld tab is ultrasonically welded directly to the body 40. To strengthen the area of the cover 42 where each of preferably plural weld tabs 47 respectively depend are reinforced zones 48 comprising a relatively thick build-up of material.

The use of the weld tabs 47 and reinforcing zones 48 strengthening the cover 42 enables the cover as a whole to be of relatively low or thin profile, thereby reducing the space requirements for the programmable programmed socket 10. The encapsulating lower body 40 not only provides the above described encapsulating function, but also provides the lower exterior of the programmable programmed socket 10, thus further reducing the number of components required for the socket and the space requirements. Additionally, the strengthening ability of the encapsulating body 40 enables use of minimum size contacts and minimum thickness of the printed circuit board support 17, even further reducing the overall space requirements for the programmable programmed socket 10. The positioning of the contacts 12, 14 in identical patterns such that each respective pair of contacts 12, 14 on the top and bottom of the support 17 is directly aligned minimizes surface space requirements for the programmable programmed socket 10, too.

Turning to FIGS. 4A, 4B and 5, the interconnection technique for coupling respective pairs of contacts 12, 14 is illustrated. FIG. 4A shows a top view of the support 17, and FIG. 4B shows a bottom view of the support 17 with several representative printed circuit traces 20, plated through holes 21 and terminal pads 25, but without any of the contacts 12, 14. Pin location numbers 1-28 are shown along the edges of the top and bottom views of the support 17 with letters "U" designating upper and "L" designating lower surfaces of the support 17, respectively, in FIGS. 4A and 4B.

As is seen in FIGS. 4A and 4B, then, each of the terminal pads 25U and 25L is electrically connected via a respective printed circuit trace 20 to a respective lead 30 of the programmable integrated crosspoint switch 1. In FIG. 5A there is illustrated schematically part of the array 50 of electrical connections existing initially in the programmable integrated crosspoint switch 1. Each of the leads 30 shown in FIG. 5A of the programmable integrated crosspoint switch is labeled with a respective pinout number corresponding to the intended terminal pad 25 to which such lead is intended for electrical connection via a respective printed circuit trace 20. For example, lead 30 which is designated "1U" is intended for electrical connection to terminal pad 25 designated "1U" shown at the upper right hand portion of FIG.

4A. Similarly, lead 30 designated "1L" in FIG. 5A would be connected to the terminal pad 25 designated "1L" in the lower right hand portion of FIG. 4B. Line 51 represents an effective electrical connection to lead 1U of FIG. 5A, and line 52, for example, represents an electrical connection to lead 4L in FIG. 5A. A circuit connection 53, including a switching element 54 of the invention, e.g. of polycrystalline material, electrically connects the lines 51 and 52. Similar circuit connections also are provided in the array 50 for connecting other respective pairs of electrical lines. For example, an electrical connection 55, including a switch element 56, connects line 57 with line 51 in the array 50. The array 50 provides selected programmed electrical connections between each of the leads 30 identified with a number and suffix "U" with all of the leads designated by a number and a suffix "L", for example, as is represented in FIG. 5A. Such connections are at high impedance and appear effectively as open circuits unless specifically programmed as is described herein.

To program the programmable integrated crosspoint switch 1, for example, to assure that the lead 1U is connected only to lead 4L, then, the circuit connection 53 including switch element 54, would receive a signal above a prescribed threshold level, e.g. as is disclosed in the above-mentioned patent, reducing the impedance of the switch element 54 to provide a substantially complete closed low impedance path therethrough. Moreover, by providing appropriate isolation paths and connection paths, a lead designated with the suffix "U" may be connected to another lead designated by the suffix "U", and the same is true for leads with suffixes designated "L".

In view of the foregoing, then, it will be appreciated that by appropriately programming the programmable integrated crosspoint switch 1, the programmable integrated crosspoint switch may be used ordinarily to effect connection of the contacts on one side of the support 17 to contacts on the other surface of the support 17. Those connections may be such that a contact in the first position on one surface of the support is connected to a contact at a different position on the opposite surface, or the connections may be provided between respective contacts in the same positions on opposite surfaces of the support.

Thus, for example, in the first row of the chart in FIG. 5B, there is indicated an electrical connection between terminal pad 25U at location number 1 on the upper surface 23 with terminal pad 25L at location number 28 on the lower surface 24 of the support 17. Such connection is provided by a printed circuit trace 58, the programmable integrated crosspoint switch 1, printed circuit trace 59, plated through hole 60, and printed circuit trace 61. The traces 58, 59 are on the upper surface 23, and the trace 61 is on the lower surface 24 of the support 17; the plated through hole 60 is an electrically conductive path between the traces 59, 61 between the upper and lower surfaces of the support 17. The second line in the chart of FIG. 5B indicates the connection between terminal pad 25U at location number 28 and terminal pad 25L at location number 5. Such connection is effected by the printed circuit trace 62 on the upper surface 23, programmable integrated crosspoint switch 1, printed circuit trace 63, plated through hole 64, and printed circuit trace 65 on the lower surface 24 of the support 17. Other exemplary connections also are shown in the chart of FIG. 5B, which is representative only and is not intended to show, necessarily, all of the connections between contacts. It is noted that at lines 4 and 5 of the chart the contact at position 19 on the lower surface of support 17 is connected to both contacts at positions 10 and 19 on the upper surface, and a double connection also is shown in the last line of the chart. It will be appreciated that more than a double connection may be provided, or even an open circuit may intentionally be effected.

According to the preferred embodiment and best mode of the present invention, the particular programmed interconnection of terminal pads 25U with terminal pads 25L can be selected as desired or required for particular circumstances. The configuration illustrated herein for the interconnection pattern only is intended to be exemplary. Preferably each of the electrical contacts 12 is electrically isolated from the other and from those electrical contacts 14 on the opposite side of the support 17, and the same is true for the contacts 14; and the only interconnection between respective electrical contacts is via the programmable integrated crosspoint switch 1 and printed circuit traces and/or plated through holes. In the usual case some of the respectively aligned contacts 12, 14, i.e. at the same contact locations, will be connected together and some of the respectively not aligned contacts 12, 14 will be connected together. To minimize the space requirements and to maximize the integrity of electrical connections provided by the programmable programmed socket 10, it is preferred that plated through holes be used to complete circuits from one side or surface of the preferably planar electrically non-conductive support 17 to the other side or surface thereof.

In some circumstances a hole may be formed in the support 17 to pass an electrical contact therethrough, whereby a single integral electrical contact is provided at the given location, such as location number 14, for both the lower contact 12 and upper contact 14 there when the upper and lower contacts at location number 14 are intended to be connected. This is not preferred for the sake of uniformity of manufacturing technique, facility of manufacturing, and strength of the programmed socket 10. Alternatively, the strapped contact approach mentioned above may be used, but such approach may require larger space requirements of the package 11 to accommodate disconnected strap portions that overhang edges of the support 17.

Figure 6:
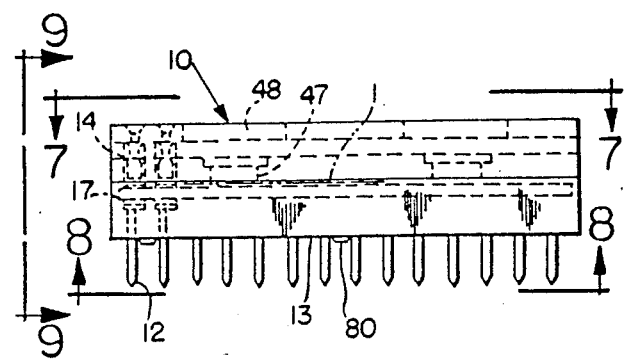
FIGS. 6–9 are, respectively, side elevation, top plan, bottom plan, and end elevation views of the programmable programmed socket.
Figure 7:
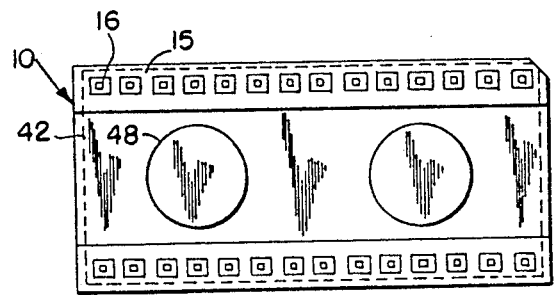
Figure 9:
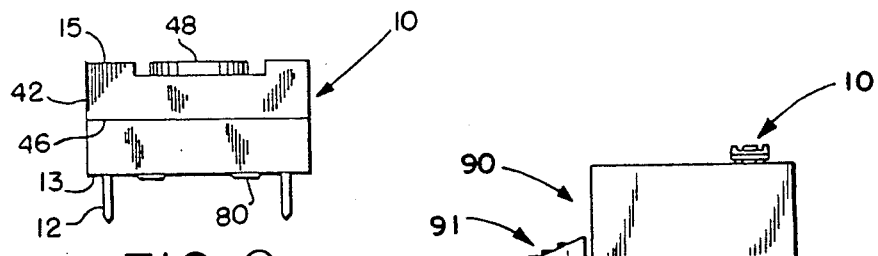

Briefly referring to FIGS. 6–9, the external layout of the programmed socket 10 is illustrated. The aligned pattern orientation of the contacts 12, 14 is seen in FIG. 6 protruding in parallel directions. The orientation of openings 16 in the top 15 of the socket 10 to guide respective pins into electrical connection with the female contacts 14 is seen particularly in FIGS. 6 and 7. The protruding male pin contacts 12 at the bottom 13 of the socket 10, and spacer bumps 80 are seen particularly in FIGS. 6, 8 and 9.

Figure 10:
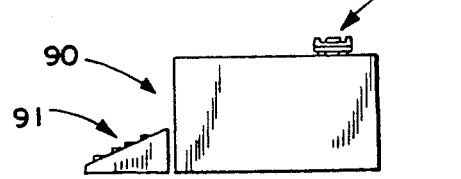
FIG. 10 is a schematic view of apparatus for programming the programmable programmed socket or other programmable integrated crosspoint switch according to the invention.
Figure 8:
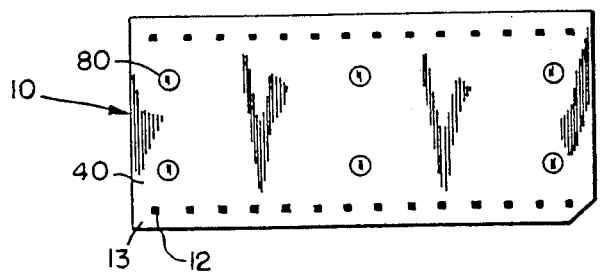

Turning to FIG. 10, an apparatus 90 for programming the programmable programmed socket 10 of the invention is shown. The apparatus 90 includes, for example, a keyboard 91 which may be operated manually, for example to input information for effecting the application of appropriate programming signals above threshold level to selected switch elements of the programmable integrated crosspoint switch 1. The apparatus 90 may be a conventional one of the type used, for example, to program a PROM or an EPROM.

In view of the foregoing, it will be appreciated that the programmable programmed socket 10 in accordance with the present invention may be programmed insofar as the connections of respective contacts therein are concerned, and the socket then may be used to interface between an integrated circuit device (or, as was mentioned earlier, virtually any dual in line package type device or the like), and a socket, connector, circuitry, etc. to which such integrated circuit device is to be connected but otherwise would not be directly connectable because of an unfavorable or unmatched pin output/connection configuration. For example, a 28 pin integrated circuit that has pin 1 used as ground and pin 28 used as a Vcc input may be substituted in an electrical circuit that ordinarily uses a different integrated circuit that has pin 1 used as Vcc and pin 28 as ground, all other pins of both integrated circuit being the same or having the same function, etc., by connecting the substituting integrated circuit in a programmed socket 10 that connects contact 14 at location 1 to contact 12 at location 28 and contact 14 at location 28 to contact 12 at location 1 and connecting the programmable programmed socket to such electrical circuit.

Importantly, it will be appreciated that the programmable programmed socket 10 according to the invention may be manufactured essentially in a generic form, i.e. without any commitment being made to what the final programming thereof will be - the connections or programming of the programmable integrated crosspoint switch 1 being undisturbed. An inventory of such programmable programmed sockets then may be maintained and provided to customers or used by a customer for any particular job requirement to effect specific pin adaptations. Accordingly, just prior to use of the programmable programmed socket 10 for a particular application, then, the socket may be programmed, as aforesaid.

Another embodiment of the invention is in the form of part of a cable assembly or cable termination assembly, e.g. as is illustrated in FIG. 11, wherein the programmable integrated crosspoint switch provides a specific adaptation of the cable conductors/connector contacts. Still another example of the present invention is the combination of a programmable integrated crosspoint switch 1 with or on a printed circuit board, or the like, to scramble, unscramble or otherwise re-locate signal traces or conductors, as is shown, for example, in FIG. 12; and in FIG. 13 such ability to change the effective location of conductors on a printed circuit board is utilized to facilitate connections of the printed circuit boards to a common chassis therefor. Furthermore, as is illustrated in FIGS. 14 and 15 the programmable integrated crosspoint switch may be employed in a device, such as an integrated circuit or separate from but in conjunction with an integrated circuit package to give a specific signature to the such integrated circuit and/or associated circuitry and to select a specific integrated circuit or integrated circuit operation. Also, as is shown in FIG. 16, the programmable integrated crosspoint switch may be used in a programmable programmed shunt device to shunt certain signals from one pin to another of such device.

In FIG. 11 the programmable cable termination assembly 110 employing the programmable integrated crosspoint switch 1 of the invention includes a multi-conductor cable 111 having conductors 112 and insulation 113, a printed circuit board 114 having two groups of plural traces 115, 116 theron, a programmable integrated crosspoint switch 1 mounted on the printed circuit board, output contacts 117 electrically connected to traces on the printed circuit board 114, and an electrically non-conductive housing 118 for supporting the other components of the cable termination assembly 110. A plurality of the traces 115 are not electrically connected to a plurality of the traces 116; however, the programmable integrated crosspoint switch 1 is connected to such traces and is intended selectively to make such connections upon being so programmed as aforesaid. The cable conductors 112 are connected to respective traces 115 and the contacts 117 are connected to respective traces 116. Therefore, according to the programming of the programmable integrated crosspoint switch 1, the conductors 112 effectively may be brought out electrically to any one or more of the contacts 117.

As is shown in FIG. 12 both a programmable integrated crosspoint switch 1 and an integrated circuit package 120 may be mounted on a printed circuit board 121. The programmable integrated crosspoint switch may be used to scramble, to unscramble, to relocate, etc. the effective location of signals or signal traces 122 on the printed circuit board 121. Scrambling and unscrambling may be provided for various security purposes. Moreover, the relocating function is particularly useful to facilitate the layout and manufacturing of the printed circuit board and components thereof so that the need for plated through holes, jumper wires, etc. to move one signal trace over across for connection to another component, contact, etc. is avoided or minimized.

An example of one use of the programmable integrated crosspoint switch 1 on printed circuit boards 130, 131 is shown in FIG. 13 whereing such plural printed circuit boards are mounted on a common chassis 132. The programmable integrated crosspoint switches 1 on such printed circuit boards 130, 131 facilitate bringing out the circuit connections of the printed circuit boards to appropriate locations for convenient connection, for example, to the circuit bus 133 of the chassis.

An integrated circuit package 140 having a programmable integrated crosspoint switch 1 to provide a specific signature to the device is shown schematically in FIG. 14. The programmable integrated crosspoint switch 1 is located in the integrated circuit housing 141 to determine what connections are made between the respective leads, terminals, contacts, etc. 142 of the integrated circuit package 140 and the integrated circuit structure 143 within the package housing 141. Thus, the integrated circuit structure 143 may be a device useful in plural applicatons depending, for example, on the connections made to the circuits thereof; and such connections can be made selectively and permanently by the programmable integrated crosspoint switch. One example of such signature condition may be to provide a particular type of RAM (random access memory device) that can be used in several different computers, depending on which of the lines is connected to ground, which to Vcc power, etc. In the past, such RAM may have been useful in only one type of computer, but with the present invention, such RAM can be configured for use in plural different computers.

In FIG. 15 is a schematic representation of a programmable integrated crosspoint switch 1 used as a circuit select device in an integrated circuit package device 150. Specifically, the integrated circuit package 150 may have plural integrated circuits 151, 152 therein with respective lead structures connected to the programmable integrated crosspoint switch 1. The leads of the programmable integrated crosspoint switch 1 are coupled to such integrated circuits 151, 152 and to the terminals, contacts, etc. of the integrated circuit package 150. Therefore, according to the programming of the programmable integrated crosspoint switch 1, the terminals, contacts, etc. of the integrated circuit package 150 will be coupled to one or the other of the integrated circuits 151, 152; or in any event, only one of such integrated circuits will be activated. It will be appreciated that the present invention, then, enables two different integrated circuits 151, 152 to be incorporated in a single integrated circuit package device 150 that can be manufactured on a relatively high volume scale, e.g. at the volume required to meet demand for both of the integrated circuits, and such volume manufacturing ordinarily would decrease manufacturing costs. Subsequently, the integrated circuit packages may be programmed to identify only one of the integrated circuits therin that will be operative.

Turning briefly to FIG. 16 a programmable programmed shunt 160 is illustrated. The shunt uses the programmable integrated crosspoint switch 1 of the present invention. Specifically, the shunt 160 includes a programmable integrated crosspoint switch 1 mounted in an integrated circuit type or other type of package or housing 161. The electrical contacts or leads 162 of the shunt 160 are exposed from the housing to make electrical connections with circuits, contacts, etc. externally of the housing 161. For example, contacts 162 may be male pin type contacts that are intended to be inserted into the female type contacts of an integrated circuit socket to effect a prescribed electrical connection pattern or arrangement of such contacts. In this way the programmable programmed shunt 160 of the present invention may be used to set up certain circuits, for security or other purposes.

Referring to FIGS. 17 and 18, a polycrystalline silicon switching element 5 used in the programmable integrated crosspoint switch 1 of the present invention for selectively connecting circuit paths between respective conductors in the matrix 2 is illustrated in detail and is described below with respect to the parts of and method of making the same. The switching element 5 includes a high resistivity polysilicon resistor section 200 terminated on one end by low resistivity doped polysilicon section 201 and metallization interconnect 202, and terminated on the other end by low resistivity doped polysilicon section 203 and metallization 204. The low resistivity doped sections 201, 203 of the switching element 5 may include either P or N type impurity. The doping may be introduced during the growing of the polycrystalline silicon by heat fusion or INM plantation. The high resistivity polysilicon 200 is essentially undoped as the concentration of impurity is very low therein.

Application of a voltage above a certain threshold voltage between terminal electrode 202 and terminal electrode 204 will cause an effectively irreversible short, i.e. of substantially lower resistivity than the high impedance condition, to occur within the semiconductor switching element 5 through the material 200. Therefore, by the application of proper programming voltage, the impedance of the switching element 5 can be transformed from essentially an open circuit to a low impedance shorted condition.

The cross sectional view of a single crosspoint 210 (or junction of the switch 5 of FIG. 1, for example) of the programmable integrated crosspoint switch matrix device 1 is shown in FIG. 18. Standard planar processing techniques may be used to construct the switch making it compatible with other LSI integrated devices. The device 1 including switches 5 is constructed on a semiconductor substrate 211 of N or P type material, the resistivity of which is relatively unimportant to the present invention. A protective oxide 28 is grown over the surface of the substrate. A bottom metallization layer 213 serves as one dimension of the matrix 2. For example, the N lines of the matrix 2 may be said to run horizontally to the drawing as in the bottom metallization line 213. The M lines of the matrix 1 may be said to run perpendicularly to the plane of the drawing and are represented by the cross sectional view of the to metallization line 214. An oxide layer 215 is deposited over the bottom metal layer 213 and is selectively etched to provide an interconnect via 220 to a low resistivity layer 221 of the semiconductor switch 5. The high resistivity polycrystalline silicon section 222 of the semiconductor switch 5 is capped by a second low resistivity region 223. The semiconductor switch 5 is then covered with a deposited oxide 224. A via or opening 225 is selectively etched through the oxide layer to provide contact to the upper low resistivity area 223 of the semiconductor switch 5. The upper metalization layer 214 is deposited on top of the upper deposited oxide layer 224 such that it makes contact with the upper low resistivity doped region 2233 through the via 225. Within this structure, programmable voltage impressed between the lower metallization line 213 and the upper metallization line 214 appears across the semiconductor switch 5.

In operation of the switch 5, voltage above a threshold value between the lower metallization line 213 and the upper metallization line 214 will cause the semiconductor switch 5 to irreversibly change state to a low impedance, thus connecting the lower line 213 to the upper line 214.

With the foregoing in mind, then, it will be appreciated that the programmable integrated crosspoint switch 1 of the present invention may be employed alone or in conjunction with one or more other devices to provide electrical interconnections at a plurality of levels on the hierarchical scheme described above.

The embodiments of the invention in which an exclusive property or privilege is claimed are, as follows:

1. A programmable integrated crosspoint switch, comprising a matrix of first and second pluralities of electrically conductive paths, and selectively permanently and affirmatively programmable means for completing respective passive, bilateral electrically conductive circuit paths between electrically conductive paths of such first plurality of electrically conductive paths and electrically conductive paths of such second plurality of electrically conductive paths, and wherein said programmable means comprises a plurality of irreversible semiconductor switching elements each of said switching elements initially having a high impedance and, thus, effectively presenting an open circuit-like condition, and each being programmable by applying an appropriate electrical input thereto to exceed a given threshold level, whereupon the element takes on a low impedance characteristic and effectively becomes a closed circuit between a respective pair of conductive paths without the need for transistor driving, logic or other circuits for useful operation.

2. A programmable integrated circuit socket comprising a housing shaped as an integrated circuit socket, plural electrical contacts having a contact portion inside said housing and a contact portion outside said housing, and a programmable integrated crosspoint switch, said programmable integrated crosspoint switch comprising a matrix of first and second pluralities of electrically conductive paths, and selectively permanently and affirmatively programmable means for completing respective passive, bilateral electrically conductive circuit paths between electrically conductive paths of such first plurality of electrically conductive paths and electrically conductive paths of such second plurality of electrically conductive paths, and wherein said programmable means comprise programmable switch elements, and wherein said housing contains said programmable means and matrix, and said contacts are electrically coupled to respective conductive paths of said matrix.

3. A programmable integrated crosspoint switch, comprising a matrix of first and second pluralities of electrically conductive paths, and selectively permanently and affirmatively programmable means for completing respective passive, bilateral electrically conductive circuit paths between electrically conductive paths of such first plurality of electrically conductive paths and electrically conductive paths of such second plurality of electrically conductive paths, and, further comprising further circuit means for carrying out prescribed functions in response to signals applied thereto, plural conductors coupled to said further circuit means, and said conductive paths being electrically connected to conductors of said further circuit means, and said programmable means being programmable to switch the positions of such conductors.

4. A signal scrambler/unscrambler comprising the programmable integrated crosspoint switch of claim 3, and means for receiving signals, and wherein said programmable integrated crosspoint switch is operable for at least one of scrambling and unscrambling such signals.

5. A programmable cable termination assembly comprising a programmable integrated crosspoint switch, comprising a matrix of first and second pluralities of electrically conductive paths, and selectively permanently and affirmatively programmable means for completing respective passive, bilateral electrically conductive circuit paths between electrically conductive paths of such first plurality of electrically conductive paths and electrically conductive paths of such second plurality of electrically conductive paths, and an electrical cable having conductors connected to respective electrically conductive paths of said programmable integrated crosspoing switch, and means for terminating said electrical cable.

6. A programmable integrated crosspoint switch, comprising a matrix of first and second pluralities of electrically conductive paths, and selectively permanently and affirmatively programmable means for completing respective passive, bilateral electrically conductive circuit paths between electrically conductive paths of such first plurality of electrically conductive paths and electrically conductive paths of such second plurality of electrically conductive paths, and further comprising a printed circuit board, plural electrically separated circuit traces on said printed circuit board, said programmable integrated crosspoint switch being mounted with respect to said printed circuit board in operative electrical connection with a plurality of said traces, and said programmable integrated crosspoint switch being programmable to effect selected electrical connections between respective traces.

7. A programmable integrated crosspoint switch as is set forth in claim 6, further comprising further circuit means mounted with respect to said printed circuit board, and said programmable integrated crosspoint switch being programmable to effect connections between said further circuit means and respective traces.

8. An electrical system, comprising a plurality of programmable integrated crosspoint switches of claim 7, and an electrical chassis, said printed circuit board comprising a plurality of printed circuit boards, each of said plurality of printed circuit boards being mountable and electrically connectable to said electrical chassis, and each of said printed circuit boards including at least one of said programmable integrated crosspoint switches thereon, said programmable means of said programmable integrated crosspoint switches being operative for determining respective electrical connection circuit paths to said electrical chassis.

9. A signature device comprises a programmable integrated crosspoint switch, including a matrix of first and second pluralities of electrically conductive paths, and selectively permanently and affirmatively programmable means for completing respective passive, bilateral electrically conductive circuit paths between electrically conductive paths of such first plurality of electrically conductive paths and electrically conductive paths of such second plurality of electrically conductive paths.

10. A circuit select device comprising a programmable integrated crosspoint switch including a matrix of first and second pluralities of electrically conductive paths, and selectively permanently and affirmatively programmable means for completing respective passive, bilateral electrically conductive circuit paths between electrically conductive paths of such first plurality of electrically conductive paths and electrically conductive paths of such second plurality of electrically conductive paths, and a plurality of circuits, and wherein said programmable integrated crosspoint switch is electrically connected to said plurality of circuits and is programmable to select for operation at least one of said plurality of circuits.

11. A method for rerouting electrical signals, comprising coupling a plurality of such signals to a first plurality of electrically conductive paths, selectively affirmatively passively bilaterally coupling a plurality of such first plurality of electrically conductive paths to respective conductive paths of a second plurality of electrically conductive paths, wherein polycrystalline silicon material switch elements couple respective ones of said first plurality of electrically conductive paths to respective ones of said second plurality of electrically conductive paths, and said selectively affirmatively coupling comprising applying an electrical signal to respective switch elements above a threshold level to cause such respective switch elements to go from a high impedance level to a relatively low impedance level, and wherein said selectively affirmatively passively coupling comprises at least one of scrambling and unscrambling electrically conductive paths to reroute such paths on at least one of a plurality of printed circuit boards of a multiple layer printed circuit board.

12. A method for rerouting electrical signals, comprising coupling a plurality of such signals to a first plurality of electrically conductive paths, selectively affirmatively passively bilaterally coupling a plurality of such first plurality of electrically conductive paths to respective conductive paths of a second plurality of electrically conductive paths, wherein polycrystalline silicon material switch elements couple respective ones of said first plurality of electrically conductive paths to respective ones of said second plurality of electrically conductive paths, and said selectively affirmatively coupling comprising applying an electrical signal to respective switch elements above a threshold level to cause such respective switch elements to go from a high impedance level to a relatively low impedance level, and wherein respective ones of such electrically conductive paths are coupled to plural respective circuits, and said rerouting comprises completing respecive conductive paths to a given one of such plural respective circuits to enable the same for operation.

13. The method of claim 12, wherein such respective circuits comprise plural respective integrated circuits in a common integrated circuit package, and such plural conductive paths comprise a matrix of conductors and a programmable integrated crosspoint switch, and such rerouting comprises enabling less than all of such plural integrated circuit for operation in such integrated circuit package.

14. A programmable shunt, comprising a housing shaped as an integrated circuit, plural electrical contacts having a contact portion inside said housing and a contact portion outside said housing, and a programmable integrated crosspoint switch, said programmable integrated crosspoint switch comprising a matrix of first and second pluralities of electrically conductive paths, and selectively permanently and affirmatively programmable means for completing respective passive, bilateral electrically conductive circuit paths between electrically conductive paths of such first plurality of electrically conductive paths and electrically conductive paths of such second plurality of electrically conductive paths, and wherein said programmable means comprise programmable switch elements, and wherein said housing contains said programmable means and matrix, and said contacts are electrically coupled to respective conductive paths of said matrix.

* * * * *